(12) United States Patent
Han et al.

(10) Patent No.: US 9,299,826 B2
(45) Date of Patent: Mar. 29, 2016

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Hauk Han, Hwaseong-si (KR); Il-Woo Kim, Incheon (KR); Jeong-Gil Lee, Hwaseong-si (KR); Yong-Il Kwon, Incheon (KR); Myoung-Bum Lee, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/204,441

(22) Filed: Mar. 11, 2014

(65) Prior Publication Data

US 2014/0264498 A1 Sep. 18, 2014

(30) Foreign Application Priority Data

Mar. 13, 2013 (KR) .......................... 10-2013-0026790

(51) Int. Cl.
| | | |
|---|---|---|
| *H01L 29/76* | (2006.01) | |
| *H01L 29/78* | (2006.01) | |
| *H01L 29/66* | (2006.01) | |
| *H01L 27/115* | (2006.01) | |
| *H01L 21/768* | (2006.01) | |

(52) U.S. Cl.
CPC .......... *H01L 29/78* (2013.01); *H01L 21/76805* (2013.01); *H01L 21/76831* (2013.01); *H01L 27/11529* (2013.01); *H01L 29/66825* (2013.01)

(58) Field of Classification Search
CPC ................ H01L 29/78; H01L 21/2008; H01L 21/76805; H01L 21/76831; H01L 29/66825; H01L 27/11529; H01L 21/76897; H01L 21/02063

USPC .......... 257/288, 410, 412, 368, 369; 438/151, 438/585, 583, 197, 199
See application file for complete search history.

(56) References Cited

U.S. PATENT DOCUMENTS

| | | | | |
|---|---|---|---|---|
| 5,981,993 | A * | 11/1999 | Cho ................... | H01L 29/42324 257/311 |
| 7,105,453 | B2 | 9/2006 | Chen et al. | |
| 2004/0178516 | A1 | 9/2004 | Ogata | |
| 2007/0145491 | A1 | 6/2007 | Shin | |
| 2008/0017904 | A1* | 1/2008 | Akiyama ................ | G11C 7/18 257/300 |
| 2008/0029825 | A1 | 2/2008 | Saito et al. | |
| 2008/0067554 | A1* | 3/2008 | Jeong ................ | H01L 27/11551 257/211 |
| 2009/0057787 | A1* | 3/2009 | Matsuki ............ | H01L 21/28088 257/411 |
| 2009/0283812 | A1* | 11/2009 | Asami ................ | G11C 16/0441 257/316 |
| 2010/0190328 | A1* | 7/2010 | Hampp ............. | H01L 21/28518 438/586 |
| 2011/0237040 | A1 | 9/2011 | Ng et al. | |
| 2014/0252477 | A1* | 9/2014 | Tseng ............... | H01L 29/66795 257/347 |

FOREIGN PATENT DOCUMENTS

| | | |
|---|---|---|
| KR | 10-2000-0025638 A | 5/2000 |
| KR | 10-2001-0060039 A | 7/2001 |
| KR | 10-2009-0077275 A | 7/2009 |

* cited by examiner

*Primary Examiner* — Jarrett Stark
*Assistant Examiner* — Shahed Ahmed
(74) *Attorney, Agent, or Firm* — Lee & Morse, P.C.

(57) ABSTRACT

A memory device includes a gate structure, a contact plug, and a spacer. The gate structure includes first and second conductive layer patterns sequentially stacked on a substrate. The contact plug passes through the second conductive layer pattern, and a sidewall of the contact plug directly contacts at least a portion of the second conductive layer pattern. The spacer surrounds a portion of the sidewall of the contact plug and contacting the gate structure.

19 Claims, 6 Drawing Sheets

MEMORY DEVICE AND METHOD OF MANUFACTURING THE SAME

CROSS-REFERENCE TO RELATED APPLICATION

Korean Patent Application No. 10-2013-0026790, filed on Mar. 13, 2013, and entitled, "Memory Device and Method Of Manufacturing The Same," is incorporated by reference herein in its entirety.

BACKGROUND

1. Field

One or more embodiments described herein relate to a memory device.

2. Description of the Related Art

A gate structure may be formed to include a lower conductive layer pattern having a relatively high resistance and an upper conductive layer pattern having a relatively low resistance. The gate structure may also include a contact plug to contact the upper conductive layer pattern, so that a contact resistance between the gate structure and the contact plug may be low.

However, the conductive layer patterns may be formed to have a thin thickness due to the high degree of integration required for memory devices. The conductive layer patterns may also be formed to have a contact hole for the contact plug, so as to expose only the upper conductive layer pattern. This is not easy to accomplish. Thus, electrical characteristics of memory devices may deteriorate due to a high contact resistance between the gate structure and the contact plug.

SUMMARY

In accordance with one embodiment, a memory device includes a gate structure including a first conductive layer pattern and a second conductive layer pattern sequentially stacked on a substrate, the second conductive layer pattern having a resistance lower than a resistance of the first conductive layer pattern; a contact plug through the second conductive layer pattern, a sidewall of the contact plug directly contacting at least a portion of the second conductive layer pattern; and a spacer surrounding a portion of the sidewall of the contact plug and contacting the gate structure.

The first conductive layer pattern may include polysilicon doped with impurities, and the second conductive layer pattern may include a metal. An insulating interlayer may cover the gate structure, and the contact plug and spacer may be formed through the insulating interlayer. The spacer may include silicon nitride.

The contact plug may include a metal layer pattern and a barrier layer pattern surrounding the metal layer pattern. The gate structure may include a gate insulating layer pattern, a third conductive layer pattern, and a dielectric layer pattern sequentially stacked between the substrate and the first conductive layer pattern. The gate structure may further include a mask on the second conductive layer pattern, wherein the contact plug and the spacer are formed though the mask.

The substrate may include a cell region in which memory cells are formed and a peripheral region in which peripheral circuits are formed. The gate structure may be formed on the peripheral region of the substrate.

In accordance with another embodiment, a method of manufacturing a memory device includes forming a gate structure including first and second conductive layer patterns sequentially stacked on a substrate; forming a recess through the second conductive layer pattern and a portion of the first conductive layer pattern; forming a spacer on a portion of a sidewall of the recess, the spacer exposing at least a portion of the second conductive layer pattern; and forming a contact plug to fill the recess.

Forming the spacer may include forming a spacer layer on an inner wall of the recess; forming a sacrificial layer on the spacer layer, the sacrificial layer exposing at least a portion of the spacer layer; and removing the exposed portion of the spacer layer to expose the portion of the second conductive layer pattern.

The method may further include etching the spacer layer anisotropically, after removing the exposed portion of the spacer layer to expose the portion of the second conductive layer pattern. Removing the exposed portion of the spacer layer to expose the portion of the second conductive layer pattern may include performing a wet etching process on the exposed portion of the spacer layer.

The sacrificial layer may be formed using a material having a poor gap-fill characteristic. The sacrificial layer may be formed using plasma enhanced oxide.

The method may further include forming an insulating interlayer to cover the gate structure, wherein the recess is formed through the insulating interlayer, and wherein the insulating interlayer is formed after the gate structure is formed. The second conductive layer pattern may be formed to have a resistance lower than are resistance of the first conductive layer.

In accordance with another embodiment, a memory device includes a gate including first and second conductive layers; a contact plug contacting the second conductive layer; and a spacer surrounding at least a portion of the sidewall of the contact plug and contacting the gate structure, wherein the second conductive layer has a resistance lower than a resistance of the first conductive layer and wherein a contact resistance between the gate and the contact plug is based on the contact plug contacting the second conductive layer.

A sidewall of the contact plug may directly contact at least a portion of the second conductive layer. Also, the device may include a bit line connected to the contact plug. The gate may correspond to a peripheral region of a substrate adjacent a memory cell region. Also, the first conductive layer may contact the second conductive layer; and the contact plug may not contact the first conductive layer under the second conductive layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
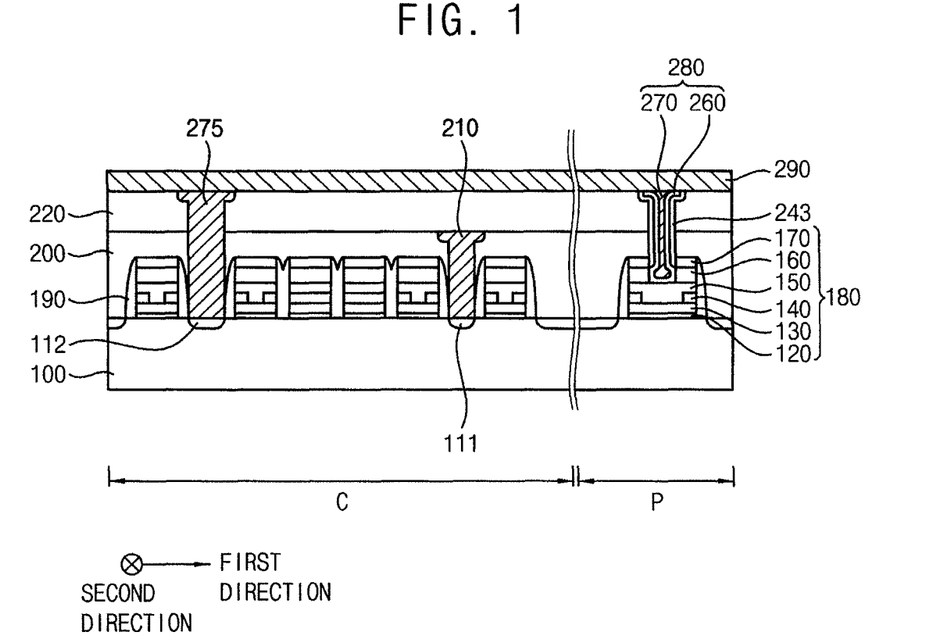
FIG. 1 illustrates an embodiment of a memory device.

FIG. 1 illustrates a cross-sectional view of an embodiment of a memory device which includes a gate structure 180 on a substrate 100, a contact plug 280, and a spacer 243. The memory device may further include a common source line (CSL) 210, a bit line contact 275, and a bit line 290.

The substrate 100 may be made of silicon, germanium, or silicon and germanium. The substrate 100 may also be a silicon-on-insulator (SOI) substrate or a germanium-on-insulator (GOI) substrate. The substrate 100 may include a cell region C in which memory cells may be formed and a peripheral region P in which peripheral circuits may be formed.

A plurality of gate structures 180 may be formed on the cell region C and the peripheral region P, respectively. Each gate structure 180 may include a gate insulating layer pattern 120, a first conductive layer pattern 130, a dielectric layer pattern 140, a second conductive layer pattern 150, a third conductive layer pattern 160, and a mask 170 subsequently stacked on the substrate 100. The third conductive layer pattern 160 may have a resistance lower than resistances of the first and second conductive layer patterns 130 and 150. In example embodiments, the first and second conductive layer patterns 130 and 150 may include polysilicon doped with impurities, and the third conductive layer pattern 160 may include a metal, e.g., tungsten (W).

First and second impurity regions 111 and 112 may be formed at upper portions of the substrate 100 adjacent to the gate structure 180. The first and second impurity regions 111 and 112 may include, e.g., n-type impurities such as phosphorus, arsenic, etc., or p-type impurities such as boron, gallium, etc.

The gate structure 180 may be covered by a first insulating interlayer 200 on the substrate 100, and a second insulating interlayer 220 may be formed on the first insulating interlayer 200. The first and second insulating interlayers 200 and 220 may include an oxide, e.g., boro phospho silicate glass (BPSG), undoped silicate glass (USG), spin on glass (SOG), etc.

The contact plug 280 may be formed through the first and second insulating interlayers 200 and 220, and the mask 170 and the third conductive layer pattern 160 of the gate structure 180 in the peripheral region P. A sidewall of the contact plug 280 may directly contact at least a portion of the third conductive layer pattern 160. That is, even though the contact plug 280 may be formed on the second conductive layer pattern 150 to contact the second conductive layer pattern 150, the contact plug 280 may also directly contact the third conductive layer pattern 160. Thus, contact resistance between the gate structure 180 and the contact plug 280 may be reduced.

In one example embodiment, the contact plug 280 may include a metal layer pattern 270 and a barrier layer pattern 260 surrounding the metal layer pattern 270. The metal layer pattern 270 may include a metal, e.g., tungsten (W), and the barrier layer pattern 260 may include, e.g., titanium (Ti) and/or titanium nitride (TiN).

The spacer 243 may surround a portion of the sidewall of the contact plug 280, and contact the gate structure 180. That is, the spacer 243 may be formed through the first and second insulating interlayers 200 and 220 and the mask 170 of the gate structure 180 to at least partially surround the sidewall of contact plug 280. In example embodiments, the spacer 243 may include silicon nitride.

The common source line (CSL) 210 may be formed through the first insulating interlayer 200 to contact a top surface of the first impurity region 111 in the cell region C. The CSL 210 may include, e.g., doped polysilicon, a metal, a metal silicide, etc.

The bit line contact 275 may be formed through the first and second insulating interlayers 200 and 220 to contact a top surface of the second impurity region 112 in the cell region C. The bit line contact 275 may include, e.g., doped polysilicon, a metal, a metal silicide, etc. In example embodiments, the bit line contact 275 may include a material substantially the same as that of the metal layer pattern 270 of the contact plug 280. In other embodiments, the bit line contact 275 and metal layer pattern 270 may be formed from different materials.

The bit line 290 may be formed on the second insulating interlayer 220, and may be electrically connected to the bit line contact 275. In one example embodiment, the bit line 290 may also be electrically connected to the contact plug 280. The bit line 290 may include, e.g., doped polysilicon, a metal, a metal silicide, etc.

Figure 2:
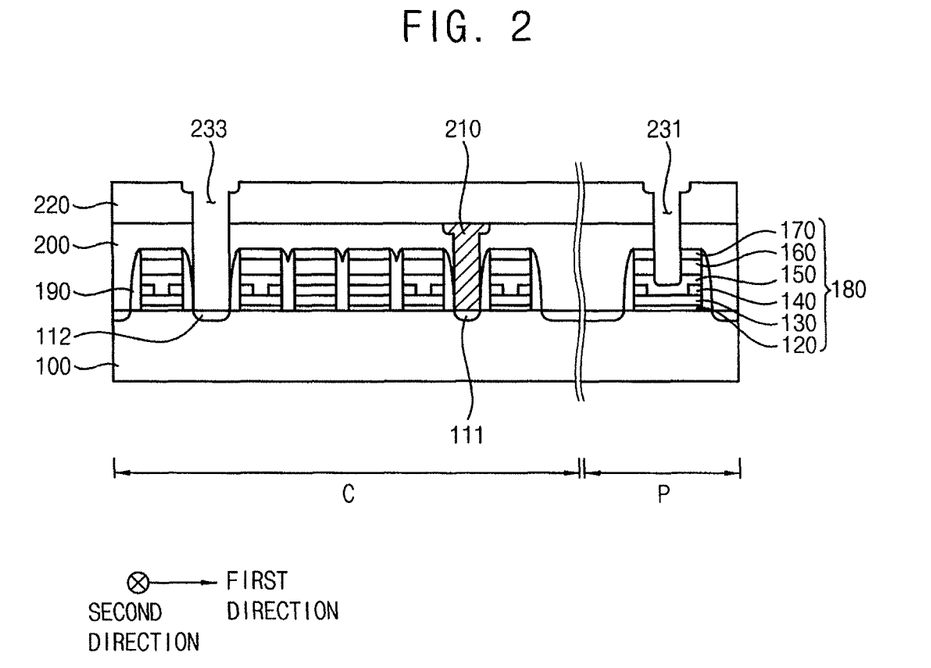
FIGS. 2 to 8 illustrate different stages of one embodiment of a method of manufacturing a memory device.

FIGS. 2 to 8 illustrate cross-sectional views of different stages of an embodiment of a method of manufacturing a memory device. Referring to FIG. 2, a gate structure 180 may be formed to include a gate insulating layer pattern 120, a first conductive layer pattern 130, a dielectric layer pattern 140, second and third conductive layer patterns 150 and 160, and a mask 170 subsequently stacked on a substrate 100. The substrate may be divided into a cell region C and a peripheral region P. A first recess 231 may be formed through the third conductive layer pattern 160 and a portion of the second conductive layer pattern 150 of the gate structure 180 in the peripheral region P.

The gate structure 180 may be formed by subsequently forming a gate insulating layer, a first conductive layer, a dielectric layer, a second conductive layer, a third conductive layer and a mask layer on the substrate 100. The gate insulating layer, the first conductive layer, the dielectric layer, the second conductive layer, the third conductive layer, and the mask layer may then be patterned. The third conductive layer may be formed to have a resistance lower than resistances of the first and second conductive layers. In example embodiments, the first and second conductive layers may be formed to include polysilicon doped with impurities, and the third conductive layer may be formed to include a metal, e.g., tungsten (W).

A spacer 190 may be formed on a sidewall of the gate structure 180. An ion implantation process may be performed on an upper portion of the substrate 100 adjacent to the gate structure 180 to form the first and second impurity regions 111 and 112. The spacer 190 may be formed to include, e.g., silicon nitride. The first and second impurity regions 111 and 112 may be formed by implanting n-type impurities, e.g., phosphorus, arsenic, etc., or p-type impurities, e.g., boron, gallium, etc.

A first insulating interlayer 200 may be formed on the substrate 100 to cover the gate structure 180. The first insulating interlayer 200 may be formed to include an oxide, e.g., boro phospho silicate glass (BPSG), undoped silicate glass (USG), spin on glass (SOG), etc.

The first insulating interlayer 200 may be partially removed to form a contact hole exposing a top surface of the first impurity region 111. A conductive layer may be formed on the substrate 100 and the first insulating interlayer 200 to sufficiently fill the contact hole. The conductive layer may be planarized until a top surface of the first insulating interlayer 200 may be exposed to form a common source line (CSL) 210. The conductive layer may be formed to include, e.g., doped polysilicon, a metal, a metal silicide, etc.

A second insulating interlayer 220 may be formed on the first insulating interlayer 200. A portion of the first and second insulating interlayers 200 and 220 and an upper portion of the gate structure 180 in the peripheral region P may be etched to form the first recess 231. Accordingly, the first recess 231 may be formed through the first and second insulating interlayers 200 and 220, the mask 170, the third conductive layer pattern 160, and a portion of the second conductive layer pattern 150 of the gate structure 180.

When the first recess 231 is formed in the peripheral region P, a first opening 233 may be formed in the cell region C simultaneously. The first opening 233 may expose a top surface of the second impurity region 112. Alternatively, the first recess 231 and the first opening 233 may be formed independently from each other and/or at different times or process operations.

Figure 3:
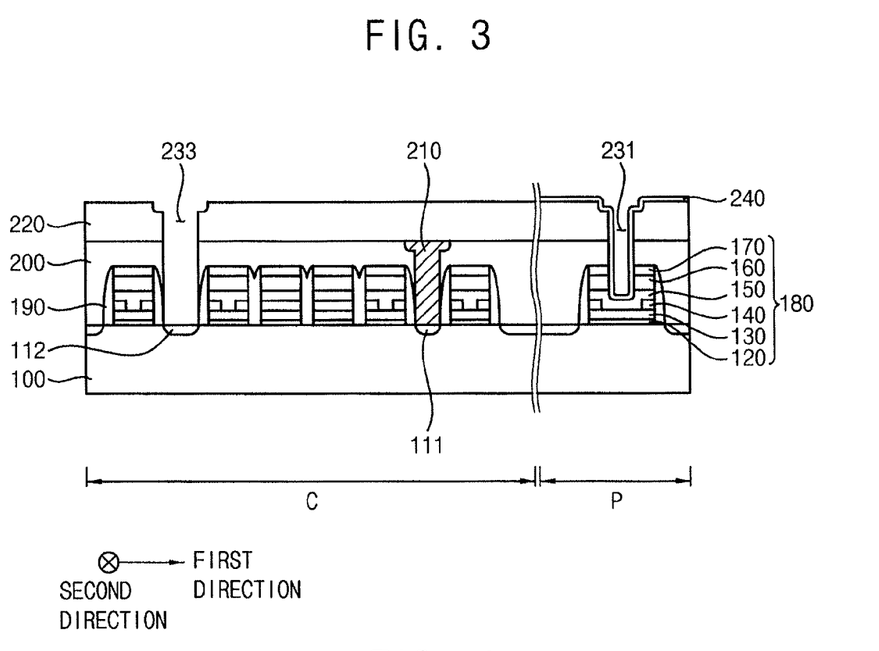

Referring to FIG. 3, a spacer layer 240 may be formed on an inner wall of the first recess 231 and a portion of the second insulating interlayer 200 in the peripheral region P. The spacer layer 240 may be formed to include, e.g., silicon nitride.

Figure 4:
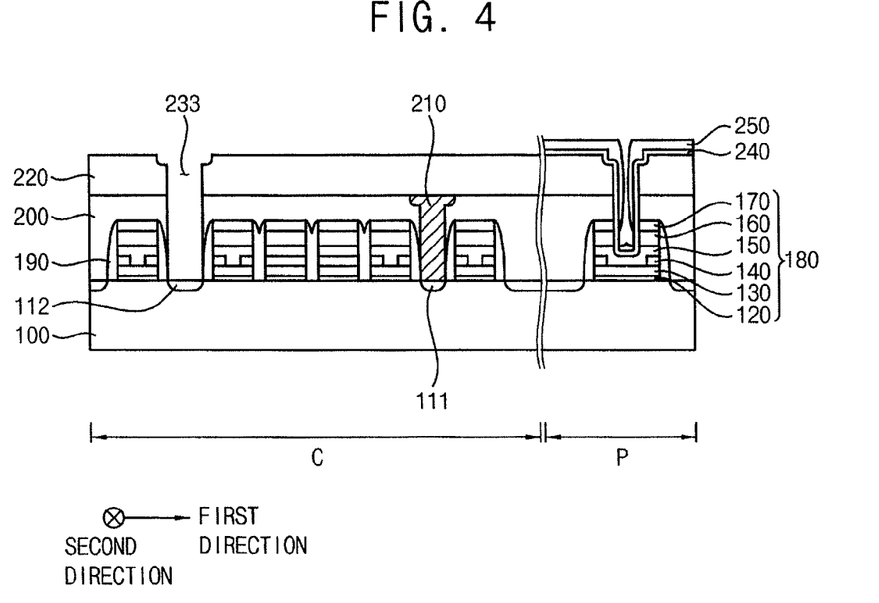

Referring to FIG. 4, a sacrificial layer 250 may be formed on the spacer layer 240, to expose at least a portion of the spacer layer 240 contacting the third conductive layer pattern 160. The sacrificial layer 250 may be formed to include a material having a poor gap-fill characteristic. Thus, the sacrificial layer 250 may be formed on an upper portion of the first recess 231 in an overhang manner. In example embodiments, the sacrificial layer 250 may be formed to include plasma enhanced oxide (PEOX). Alternatively, the sacrificial layer 250 may be formed to include, an amorphous carbon layer (ALC), or silicon (Si), oxygen (O), nitrogen (N), hydrogen (H), and/or a compound thereof, e.g., silicon oxide, silicon oxynitride, etc.

Figure 5:
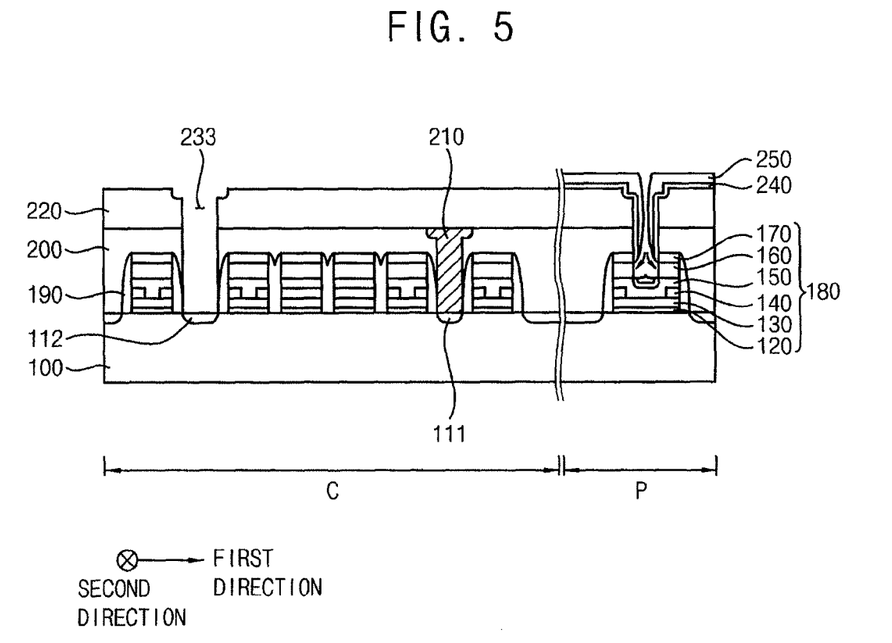

Referring to FIG. 5, the exposed portion of the spacer layer 240 may be removed using the sacrificial layer 250 as an etching mask to expose a portion of the third conductive layer pattern 160. In example embodiments, the exposed portion of the spacer 240 may be removed by a plasma dry etch process and/or a wet etch process. In one example embodiment, the wet etch may be performed using, e.g., phosphoric acid ($H_3PO_4$).

Figure 6:
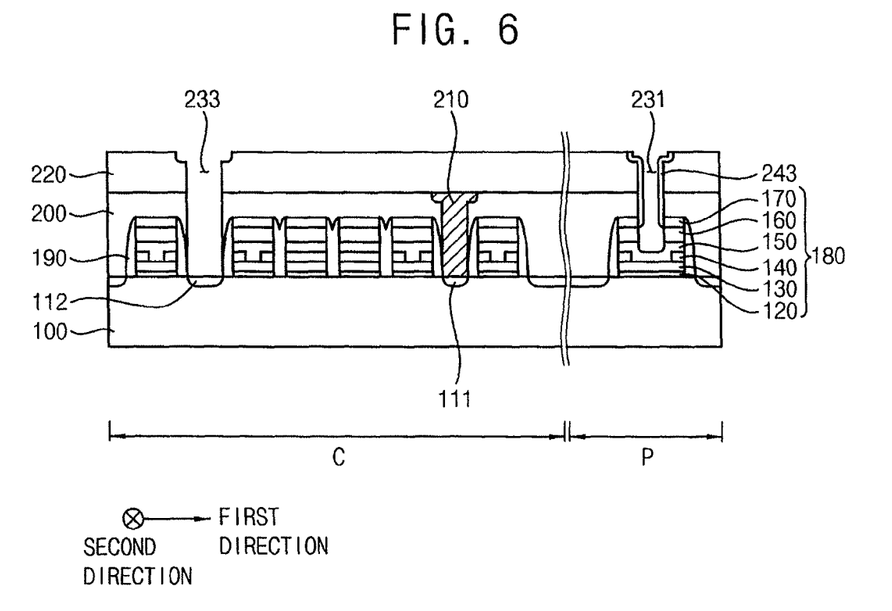
Figure 7:
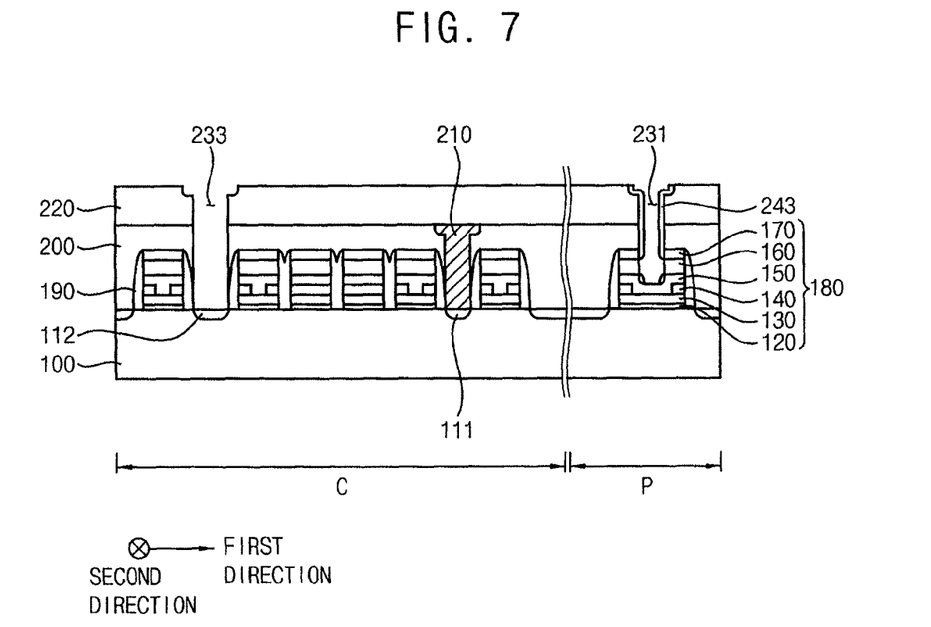

Referring to FIG. 6, after the sacrificial layer 250 is removed, the spacer layer 240 may be etched anisotropically. Accordingly, a spacer 243 exposing the portion of the third conductive layer 160 may be formed on a portion of the sidewall of the first recess 231. In some embodiments, the spacer layer 240 may remain on the second conductive layer pattern 150 at a lower portion of the sidewall of the first recess 231, as shown in FIG. 7. The sacrificial layer 250 may be removed by a wet etch process using, e.g., hydrofluoric acid (HF).

A cleaning process may be performed to remove residue in the first recess 231. A fourth conductive layer pattern may be formed on the second conductive layer pattern 150 to at least partially fill a lower portion of the first recess 231. The cleaning process may be performed by a wet etch process using, e.g., hydrofluoric acid (HF).

The fourth conductive layer pattern may be formed to include a material substantially the same as that of the second conductive layer pattern 150. Accordingly, the fourth conductive layer pattern and the second conductive layer pattern 150 may be merged into one layer pattern. (Hereinafter, the merged layer pattern may be referred to simply as the second conductive layer pattern 150). That is, a portion of the second conductive layer pattern 150 that has been over-etched during formation of the first recess 231 may be filled by the fourth conductive layer pattern.

Figure 8:
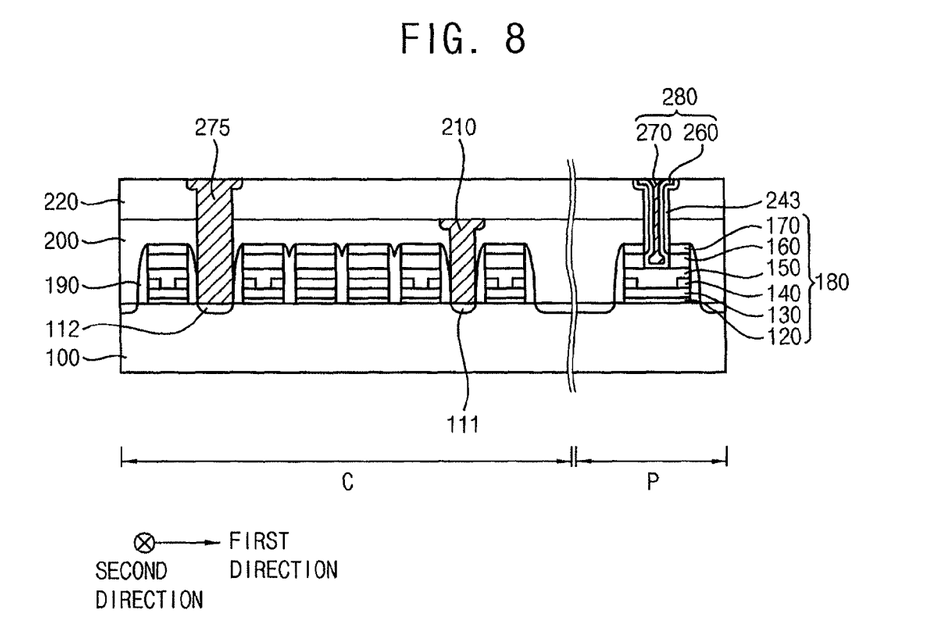

Referring to FIG. 8, a contact plug 280 may be formed to substantially fill the first recess 231. The contact plug 280 may be formed by forming a barrier layer on the spacer 243, the inner wall of the first recess 231, and the second insulating interlayer 200. A metal layer may be formed to sufficiently fill a remaining portion of the first recess 231. The barrier layer and metal layer may then be planarized by a chemical mechanical polishing (CMP) process and/or an etch back process, until a top surface of the second insulating interlayer 220 is exposed. Accordingly, the contact plug 280 may be formed to include a metal layer pattern 270 and a barrier layer pattern 260 surrounding the metal layer pattern 270.

As previously described, the contact plug 280 may be formed to contact at least a portion of the third conductive layer pattern 160. That is, even though the contact plug 280 may be formed on and contact the second conductive layer pattern 150 having a relatively high resistance, the contact plug 280 may also contact the third conductive layer pattern 160 having a relatively low resistance. Thus, the contact resistance between the gate structure 180 and the contact plug 280 may be reduced. The metal layer may be formed to include a metal, e.g., tungsten (W), and the barrier layer may be formed to include titanium (Ti) and/or titanium nitride (TiN).

A bit line contact 275 may be formed in cell region C to sufficiently fill the first opening 233. In one example embodiment, the bit line contact 275 may be formed by forming the metal layer, not only in peripheral region P, but also in cell region C to fill the first opening 233. This may be performed after formation of the barrier layer in peripheral region P, and after planarizing the metal layer until the top surface of the second insulating interlayer 220 is exposed. Alternatively, the bit line contact 275 and the contact plug 280 may be formed independently from each other.

Referring again to FIG. 1, a bit line 290 may be formed on the second insulating interlayer 220 to contact the bit line contact 275. In one example embodiment, the bit line 290 may be formed to contact the contact plug 280. The bit line 290 may be formed to include, e.g., a metal, a metal silicide, doped polysilicon, etc. In one example embodiment, the bit line 290 may be formed to extend in a first direction.

As previously described, the contact plug 280 may be formed to contact the gate structure 180, including the first and second conductive layer patterns 130 and 150 having a relatively high resistance and the third conductive layer pattern 160 having a relatively low resistance. A portion of the spacer layer 240 surrounding the sidewall of the contact plug 280 may be removed, so that the contact plug 280 may contact the third conductive layer pattern 160 directly. That is, even though the first recess 231 for the contact plug 280 may be formed on the second conductive layer pattern 150 (due to the difficulty of controlling an etching process), the contact plug 280 may directly contact at least a portion of the third conductive layer pattern 160 to reduce the resistance between the gate structure 180 and contact plug 280. Therefore, poor resistance caused by a high integration of memory devices may be prevented.

Figure 9:
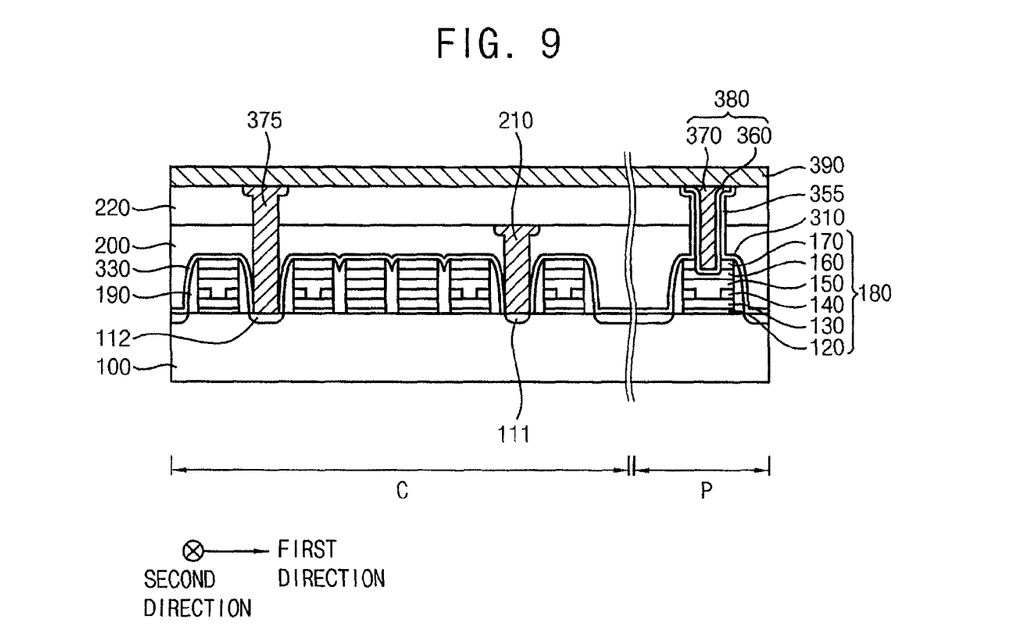
FIG. 9 illustrates another embodiment of a memory device.

FIG. 9 illustrates a cross-sectional view of another embodiment of a memory device. The memory device of FIG. 9 may be substantially the same as or similar to that of FIG. 1, except for a contact plug, a liner layer, and a spacer.

Referring to FIG. 9, the memory device may include the gate structure 180 on the substrate 100, a liner layer 330, a contact plug 380, and a spacer 355. The memory device may further include common source line (CSL) 210, a bit line contact 375, and a bit line 390. The substrate 100 may also include cell region C and peripheral region P in which peripheral circuits may be formed.

A plurality of gate structures 180 may be formed on cell region C and peripheral region P of substrate 100. Each gate structure 180 may include the gate insulating layer pattern 120, the first conductive layer pattern 130, the dielectric layer pattern 140, the second conductive layer pattern 150, the third conductive layer pattern 160, and mask 170 subsequently stacked on the substrate 100. The third conductive layer pattern 160 may have a resistance lower than those of the first and second conductive layer patterns 130 and 150. In example embodiments, the first and second conductive layer patterns 130 and 150 may include polysilicon doped with impurities, and the third conductive layer pattern 160 may include a metal, e.g., tungsten (W).

The first and second impurity regions 111 and 112 may be formed at the upper portions of the substrate 100 adjacent to the gate structure 180. The first and second impurity regions 111 and 112 may include n-type impurities, e.g., phosphorus, arsenic, etc., or p-type impurities, e.g., boron, gallium, etc.

The gate structure 180 may be covered by the first insulating interlayer 200 on the substrate 100. The second insulating interlayer 220 may be formed on the first insulating interlayer 200. The first and second insulating interlayers 200 and 220 may include an oxide, e.g., boro phospho silicate glass (BPSG), undoped silicate glass (USG), spin on glass (SOG), etc.

The liner layer 330 may be formed between the substrate 100 and first insulating interlayer 200 in cell region C to surround gate structure 180. In example embodiments, the liner layer 330 may include silicon nitride.

The contact plug 380 may be formed through the first and second insulating interlayers 200 and 220, the mask 170, and the portion of the third conductive layer pattern 160 of the gate structure 180 in peripheral region P. That is, the contact plug 380 may be formed on the third conductive layer pattern 160 to directly contact only the third conductive layer pattern 160. Thus, a contact resistance between the gate structure 180 and the contact plug 380 may be reduced.

In one example embodiment, contact plug 380 may include a metal layer pattern 370 and a barrier layer pattern 360 surrounding the metal layer pattern 370. The metal layer pattern 370 may include a metal, e.g., tungsten (W), and the barrier layer pattern 360 may include, e.g., titanium (Ti) and/or titanium nitride (TiN).

The spacer 355 may be formed in peripheral region P of the substrate 100 to surround the portion of the sidewall of the contact plug 380 and a sidewall and a portion of a top surface of the gate structure 180. That is, spacer 355 may be formed through the first and second insulating interlayers 200 and 220 to contact at least a top surface of the mask 170 of the gate structure 180. In example embodiments, the spacer 355 may include a material substantially the same as that of the liner layer 330.

The CSL 210 may be formed through the first insulating interlayer 200 to contact the top surface of the first impurity region 111 in cell region C. The CSL 210 may include, e.g., doped polysilicon, a metal, a metal silicide, etc.

The bit line contact 375 may be formed through the first and second insulating interlayers 200 and 220, to contact a top surface of the second impurity region 112 in cell region C. The bit line contact 375 may include, e.g., doped polysilicon, a metal, a metal silicide, etc. In example embodiments, the bit line contact 375 may include a material substantially the same as that of the metal layer pattern 370 of the contact plug 380. The bit line 390 may be formed on the second insulating interlayer 220, and may be electrically connected to the bit line contact 375 and contact plug 380. The bit line 390 may include, e.g., doped polysilicon, a metal, a metal silicide, etc.

Figure 10:
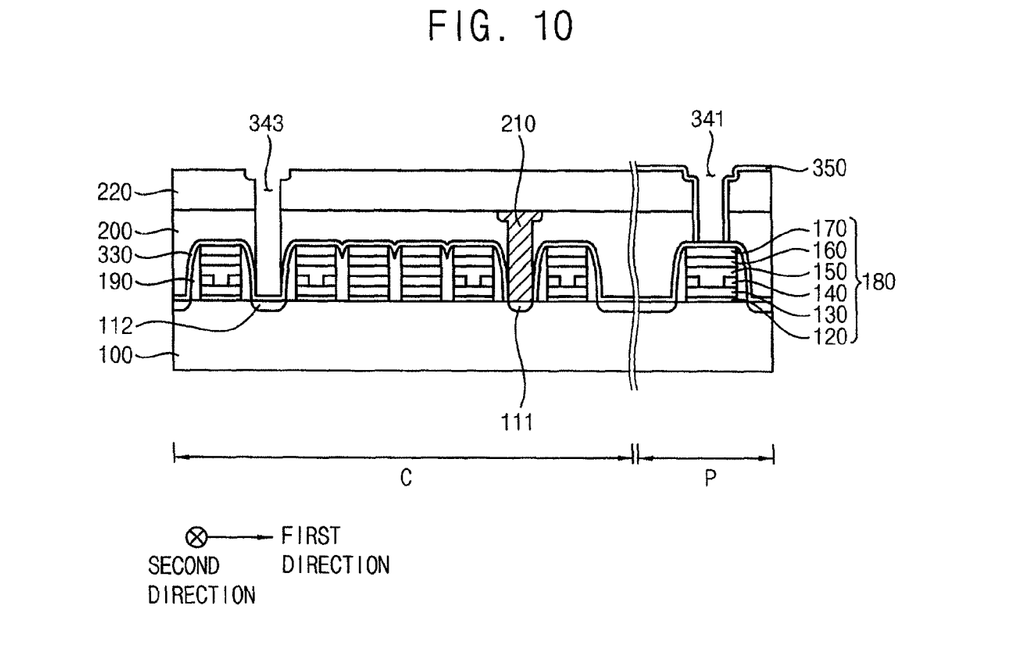
FIGS. 10 to 12 illustrate different stages of another method of manufacturing a memory device.
Figure 11:
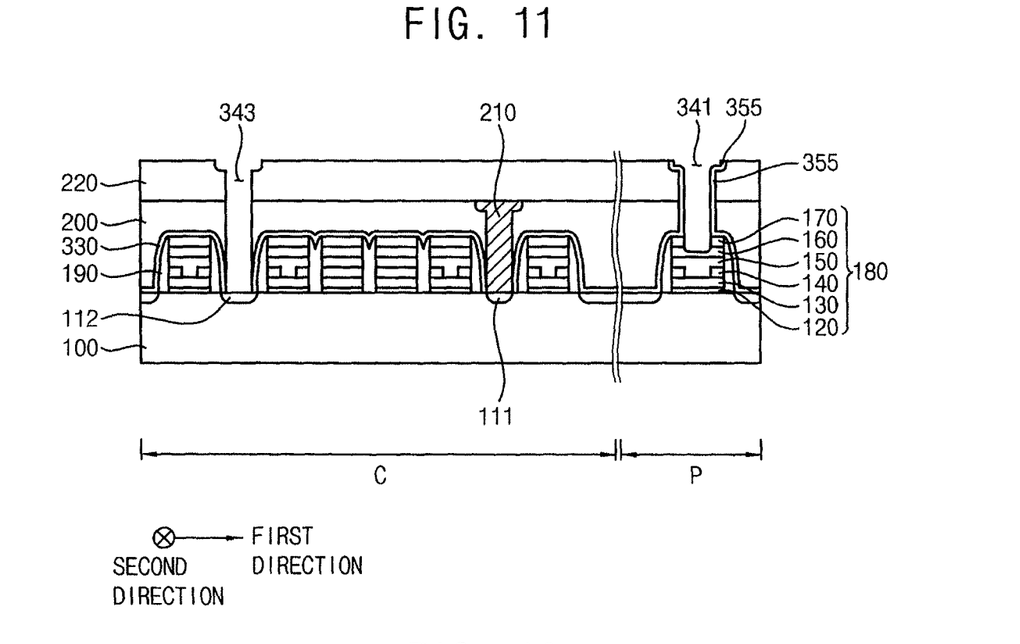
Figure 12:
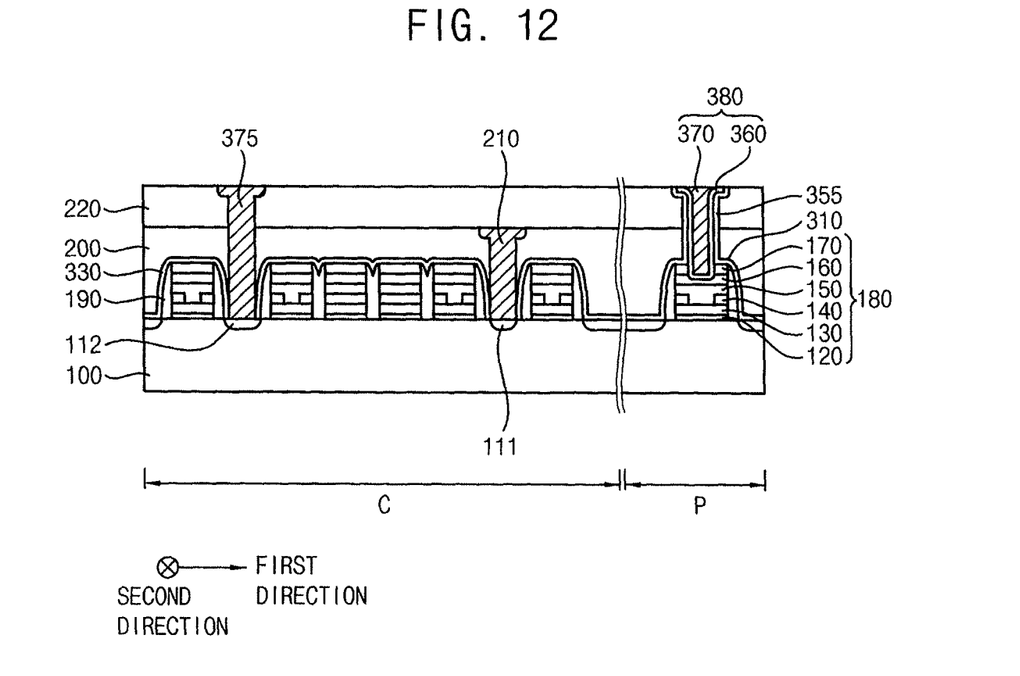

FIGS. 10 to 12 are cross-sectional views illustrating different stages of another method of manufacturing a memory device. This method may include processes substantially the same as or similar to those illustrated with reference to FIGS. 2 to 8.

Referring to FIG. 10, gate structure 180 including gate insulating layer pattern 120, first conductive layer pattern 130, dielectric layer pattern 140, second and third conductive layer patterns 150 and 160, and mask 170 may be formed to be subsequently stacked on substrate 100. The substrate 100 may be divided into a cell region C and a peripheral region P, and a second recess 341 may be formed on the gate structure 180 in the peripheral region P The gate structure 180 may be formed by subsequently forming the gate insulating layer, the first conductive layer, the dielectric layer, the second conductive layer, the third conductive layer and the mask layer on the substrate 100. The gate insulating layer, the first conductive layer, the dielectric layer, the second conductive layer, the third conductive layer, and the mask layer may be patterned. The third conductive layer may be formed to have a resistance lower than those of the first and second conductive layers. In example embodiments, the first and second conductive layers may be formed to include polysilicon doped with impurities. The third conductive layer may be formed to include a metal, e.g., tungsten (W).

The spacer 190 may be formed on the sidewall of gate structure 180. The first and second impurity regions 111 and 112 may be formed by performing an ion implantation process at the upper portions of the substrate 100 adjacent to the gate structure 180.

A liner layer 330 surrounding gate structure 180 may be formed on the substrate 100 to include, e.g., silicon nitride. The first insulating interlayer 200 may be formed on the liner layer 330 to cover the gate structure 180. The first insulating interlayer 200 may be formed to include an oxide, e.g., boro phospho silicate glass (BPSG), undoped silicate glass (USG), spin on glass (SOG), etc.

The CSL 210 may be formed through the first insulating interlayer 200 to contact the first impurity region 111. The CSL 210 may include, e.g., doped polysilicon, a metal, a metal silicide, etc.

A second recess 341 may be formed by forming the second insulating interlayer 220 on the first insulating interlayer 200. The first and second insulating interlayers 200 and 220 in peripheral region P may then be partially etched, by partially using liner layer 330 as an etch stop layer. Accordingly, the second recess 341 may be formed through the first and second insulating interlayers 200 and 220 to partially expose a top surface of the liner layer 330 on the mask 170 of the gate structure 180.

When the second recess 341 is formed in peripheral region P, a second opening 343 exposing the liner layer 330 on the second impurity region 112 may be formed in cell region C simultaneously. Alternatively, the second recess 341 and the second opening 343 may be formed independently from each other and/or at different times.

A spacer layer 350 may be formed on an inner wall of the second recess 341 and a portion of the second insulating interlayer 220 in peripheral region P. The spacer layer 350 may be formed to include a material substantially the same as that of liner layer 330. Accordingly, the spacer layer 350 and liner layer 330 may be merged into one layer in the peripheral region P of the substrate 100. Hereinafter, the merged layer may be referred to simply as the spacer layer 350.

Referring to FIG. 11, the spacer layer 350 may be etched anisotropically to remove portions of the spacer layer 350 on the second insulating interlayer 220 and the mask 170 of the gate structure 180. Thus, an upper portion of the mask 170 may be partially exposed. The exposed portion of the spacer layer 170 and a portion of the third conductive layer pattern 160 may be removed by a dry etch process. Accordingly, a spacer 355 may be formed partially on a sidewall of the second recess 341.

When the spacer 355 is formed in peripheral region P, a portion of the liner layer 330 exposed by the second opening 343 may be removed to expose the second impurity region 112 in cell region C. Alternatively, the portion of liner layer 330 may be removed independently from the process for forming the spacer 355.

Referring to FIG. 12, a contact plug 380 may be formed to substantially fill the second recess 341. The contact plug 380 may be formed by forming a barrier layer on the inner wall of the second recess 341, the spacer 355, and the second insulating interlayer 200 using, e.g., titanium (Ti), titanium nitride (TiN), etc. A metal layer may then be formed using, e.g., tungsten (W), etc., to sufficiently fill a remaining portion of the second recess 341. The barrier layer and the metal layer may then be planarized until the top surface of the second insulating interlayer 220 is exposed. Accordingly, the contact plug 380 may be formed to include a metal layer pattern 370 and a barrier layer pattern 360 surrounding the metal layer pattern 370.

As previously described, the contact plug 380 may be formed on the third conductive layer pattern 160 to directly contact only the third conductive layer pattern 160. Thus, a contact resistance between the gate structure 180 and the contact plug 380 may be reduced.

A bit line contact 375 may be formed in cell region C to substantially fill the second opening 343. In one example embodiment, bit line contact 375 may be formed by forming the metal layer not only the peripheral region P, but also the cell region C to fill the second opening 343 after the formation of the barrier layer in the peripheral region P. The metal layer may then be planarized until the top surface of the second insulating interlayer 220 is exposed. Alternatively, the bit line contact 375 may be formed independently from the process for forming the contact plug 380.

Referring again to FIG. 9, a bit line 390 may be formed on the second insulating interlayer 220 to contact the bit line contact 375. In one example embodiment, the bit line 390 may be formed to contact the contact plug 380. The bit line 390 may be formed to include, e.g., a metal, a metal silicide, doped polysilicon, etc. In one example embodiment, the bit line 290 may be formed to extend in a first direction.

As described, when the contact plug 380 is formed to contact the gate structure 180 including the first and second conductive layer patterns 130 and 150 having a relatively high resistance and the third conductive layer pattern 160 having a relatively low resistance, the liner layer 330 may be formed to cover the gate structure 180 before the first insulating interlayer 200 is formed. The second recess 341 may be formed using the liner layer 330 as an etch stop layer, to form the contact plug 380 on the third conductive layer pattern 160. That is, the contact plug 380 may be formed to directly contact only the third conductive layer pattern 160, not the first and second conductive layer patterns 130 and 150. Thus, a contact resistance between the gate structure 180 and the contact plug 380 may be reduced.

A method of manufacturing a two-dimensional memory device has been described in connection with the aforementioned embodiments. However, in another embodiment, a three-dimensional memory device may be formed by processes substantially the same as or similar to those discussed above. That is, a three-dimensional memory device may have a structure substantially the same as that of a two-dimensional memory device in a peripheral region. Thus, a contact plug contacting a gate structure may be formed in the three-dimensional memory device by removing a portion of the spacer surrounding a sidewall of the contact plug, or forming a liner layer to cover the gate structure and forming a recess using the liner layer as an etch stop layer.

By way of summation and review, forming a contact hole for the contact plug so as to expose only the second conductive layer pattern is not easy when the conductive layer patterns of the gate structure have a thin thickness due to the high integration degree of the flash memory device.

In accordance with embodiments, a portion of a spacer formed on a sidewall of the contact plug adjacent to the second conductive layer pattern may be removed so that the contact plug may directly contact the second conductive layer pattern. That is, even though the contact hole for forming the contact plug may be formed on the first conductive layer pattern due to a difficulty of controlling an etching process, the contact plug may contact at least a portion of the second conductive layer pattern directly. Therefore, a resistance between the gate structure and the contact plug may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a gate structure including a first conductive layer pattern and a second conductive layer pattern sequentially stacked on a substrate, the second conductive layer pattern having a resistance lower than a resistance of the first conductive layer pattern;
a contact plug passing through an upper surface of the second conductive layer pattern and penetrating into the second conductive layer pattern, a sidewall of the contact plug directly contacting at least a portion of the second conductive layer pattern; and a spacer surrounding a portion of the sidewall of the contact plug and contacting the gate structure, wherein the contact plug includes a metal layer pattern and a barrier layer pattern surrounding the metal layer pattern, and wherein a width of at least a portion of the barrier layer pattern contacting the second conductive layer pattern is greater than widths of other portions of the barrier layer pattern not contacting the second conductive layer pattern.

2. The memory device as claimed in claim 1, wherein:
the first conductive layer pattern includes polysilicon doped with impurities, and
the second conductive layer pattern includes a metal.

3. The memory device as claimed in claim 1, further comprising: an insulating interlayer covering the gate structure, wherein the contact plug and the spacer are formed through the insulating interlayer.

4. The memory device as claimed in claim 1, wherein spacer includes silicon nitride.

5. The memory device as claimed in claim 1, wherein the gate structure includes a gate insulating layer pattern, a third conductive layer pattern, and a dielectric layer pattern sequentially stacked between the substrate and the first conductive layer pattern, the gate structure further including a mask on the second conductive layer pattern, wherein the contact plug and the spacer are formed though the mask.

6. The memory device as claimed in claim 5, wherein:
the substrate includes a cell region in which memory cells are formed and a peripheral region in which peripheral circuits are formed, and
the gate structure is formed on the peripheral region of the substrate.

7. A method of manufacturing a memory device, the method comprising:
forming a gate structure including first and second conductive layer patterns sequentially stacked on a substrate;
forming a recess passing through an upper surface of the second conductive layer pattern and penetrating into the second conductive layer pattern on a portion of the first conductive layer pattern;
forming a spacer on a portion of a sidewall of the recess, the spacer exposing at least a portion of the second conductive layer pattern; and
forming a contact plug to fill the recess, wherein the contact plug includes a metal layer pattern and a barrier layer pattern surrounding the metal layer pattern, and wherein a width of at least a portion of the barrier layer pattern contacting the second conductive layer pattern is greater than widths of other portions of the barrier layer pattern not contacting the second conductive layer pattern.

8. The method as claimed in claim 7, wherein forming the spacer includes:
forming a spacer layer on an inner wall of the recess;
forming a sacrificial layer on the spacer layer, the sacrificial layer exposing at least a portion of the spacer layer; and
removing the exposed portion of the spacer layer to expose the portion of the second conductive layer pattern.

9. The method as claimed in claim 8, further comprising:
etching the spacer layer anisotropically, after removing the exposed portion of the spacer layer to expose the portion of the second conductive layer pattern.

10. The method as claimed in claim 8, wherein removing the exposed portion of the spacer layer to expose the portion of the second conductive layer pattern includes performing a wet etching process on the exposed portion of the spacer layer.

11. The method as claimed in claim 8, wherein the sacrificial layer is formed using a material having a poor gap-fill characteristic.

12. The method as claimed in claim 11, wherein the sacrificial layer is formed using plasma enhanced oxide (PEOX).

13. The method as claimed in claim 7, further comprising:
forming an insulating interlayer to cover the gate structure, wherein the recess is formed through the insulating interlayer, and
wherein the insulating interlayer is formed after the gate structure is formed.

14. The method as claimed in claim 7, wherein the second conductive layer pattern is formed to have a resistance lower than are resistance of the first conductive layer.

15. A memory device, comprising:
a gate including first and second conductive layers;
a contact plug contacting the second conductive layer; and
a spacer surrounding at least a portion of a sidewall of the contact plug and contacting the gate structure, wherein the contact plug passes through an upper surface of the second conductive layer and penetrates into the second conductive layer, wherein the second conductive layer has a resistance lower than a resistance of the first conductive layer, wherein a contact resistance between the gate and the contact plug is based on the contact plug contacting the second conductive layer, wherein the contact plug includes a metal layer pattern and a barrier layer pattern surrounding the metal layer pattern, and wherein a width of at least a portion of the barrier layer pattern contacting the second conductive layer is greater than widths of other portions of the barrier layer pattern not contacting the second conductive layer.

16. The memory device as claimed in claim 15, wherein a sidewall of the contact plug directly contacts at least a portion of the second conductive layer.

17. The memory device as claimed in claim 15, further comprising
a bit line connected to the contact plug.

18. The memory device as claimed in claim 15, wherein the gate corresponds to a peripheral region of a substrate adjacent a memory cell region.

19. The memory device as claimed in claim 15, wherein
the first conductive layer contacts the second conductive layer; and
the contact plug does not contact the first conductive layer under the second conductive layer.

* * * * *